United States Patent [19]
Lin et al.

[11] Patent Number: 5,956,566
[45] Date of Patent: Sep. 21, 1999

[54] METHOD AND TEST SITE TO MONITOR ALIGNMENT SHIFT AND BURIED CONTACT TRENCH FORMATION

[75] Inventors: Jyh-Feng Lin, Hua-Lien County; Hon-Hung Lui; Yi-Te Chen, both of Hsi-Chu, all of Taiwan

[73] Assignee: Taiwan Semiconductor Manufacturing Company, Ltd., Hsin-Chu, Taiwan

[21] Appl. No.: 09/213,454

[22] Filed: Dec. 17, 1998

[51] Int. Cl.⁶ ............................ G01R 27/14; G01R 31/26
[52] U.S. Cl. ................................ 438/17; 438/14; 438/22; 257/48
[58] Field of Search .................... 438/14, 17, 22, 438/23, 34; 257/48

[56] References Cited

U.S. PATENT DOCUMENTS

| | | |
|---|---|---|
| 4,871,962 | 10/1989 | Cheung . |
| 5,552,718 | 9/1996 | Bruce et al. . |
| 5,629,772 | 5/1997 | Ausschnitt . |
| 5,756,238 | 5/1998 | Barr et al. . |
| 5,757,507 | 5/1998 | Auschnitt et al. . |
| 5,790,254 | 12/1998 | Ausschnitt . |

FOREIGN PATENT DOCUMENTS

| | | |
|---|---|---|
| 3831086 | 2/1990 | Germany . |
| 3-142848 | 6/1991 | Japan . |
| 4-236644 | 8/1992 | Japan . |

OTHER PUBLICATIONS

IBM Technical Disclosure Bulletin, vol. 32, No. 12, p240, May 1990.

*Primary Examiner*—Charles Bowers
*Assistant Examiner*—Martin Sulsky
*Attorney, Agent, or Firm*—George O. Saile; Stephen B. Ackerman; Larry J. Prescott

[57] ABSTRACT

A method and test site for monitoring the extent of buried contact trench formation in MOS FET integrated circuit wafers is described. A number of doped silicon parallel first test electrodes are formed in test site regions of a wafer and connected in series. The test site regions are located in the spaces between chip regions of the wafer. A layer of gate oxide is then deposited over the wafer. Test openings over the first test electrodes and buried contact openings are etched in the gate oxide layer at the same time. The test openings have the same size and shape as the buried contact openings. After polysilicon and metal silicide is deposited a photoresist mask is formed to etch the buried contact electrodes, the gate electrodes, and second test electrodes which are located directly above the test openings. Any misalignment in the photoresist mask will cause trenches to be formed in the first test electrodes as well as the formation of buried contact trenches. These trenches in the first test electrodes will cause an increase the resistance of the first test electrodes which is related to the extent of the buried contact trenches. The first test electrodes can be oriented to measure the extent of buried contact trench formation regardless of orientation.

19 Claims, 7 Drawing Sheets

METHOD AND TEST SITE TO MONITOR ALIGNMENT SHIFT AND BURIED CONTACT TRENCH FORMATION

BACKGROUND OF THE INVENTION

(1) FIELD OF THE INVENTION

This invention relates to a test site and method of using a test site to monitor the extent of mask misalignment and buried contact trench formation in MOS FET integrated circuits.

(2) DESCRIPTION OF THE RELATED ART

The process of forming buried contacts frequently results in the formation of buried contact trenches. These trenches are a problem particularly for shallow junction devices. This invention describes a method and test site for monitoring the extent of these trenches.

U.S. Pat. No. 5,637,186 to Liu et al. describes a method and monitor test site to measure semiconductor device dimensions.

U.S. Pat. No. 5,633,173 to Bae describes a method of forming dummy dies at edge portions of a wafer. The wafers are analyzed in a defect detecting apparatus and the defect data is used to inspect for process defects at subsequent process steps.

U.S. Pat. No. 5,296,917 to Kusonose et al. describes a method of inspecting and measuring the accuracy with which patterns are written on an integrated circuit wafer.

U.S. Pat. No. 5,721,146 to Liaw et al. describes a method of forming a buried contact within a trench etched into the silicon substrate.

U.S. Pat. No. 5,654,231 to Liang et al. describes a method of eliminating a buried contact trench in the formation of buried contacts.

U.S. Pat. No. 5,668,051 to Chen et al. describes a method of forming buried contacts having reduced series resistance. The buried contact trench is filled with doped polysilicon which reduces the series resistance between the buried contact and the source/drain regions.

U.S. Pat. No. 5,004,658 to Hjulstrom describes a system and method for adjusting the capacitance of thin film capacitors. Adjustment patterns comprising parallel adjustment lines are used. The adjustment lines are offset aligned with corresponding lines of a photolithographic mask during the formation of the metal capacitor plates.

SUMMARY OF THE INVENTION

Buried contacts are frequently used in dense circuit layouts using metal oxide semiconductor field effect transistors to reduce the resistance to the source or drain regions of a transistor. Polysilicon electrodes are used to make contact to the buried contacts. These polysilicon electrodes are formed from a blanket layer of polysilicon deposited on a layer of gate oxide having a contact opening etched over the buried contact region. The polysilicon electrodes are etched from the blanket layer of polysilicon using photoresist masks. If there is any misalignment between the photoresist mask and the contact hole etched in the layer of gate oxide, the etching of polysilicon electrodes making contact to the buried contact will result in the formation of a buried contact trench at the edge of the buried contact region. This buried contact trench is between the buried contact and the source/drain region and increases the series resistance between the buried contact and the source/drain region.

Figure 1:
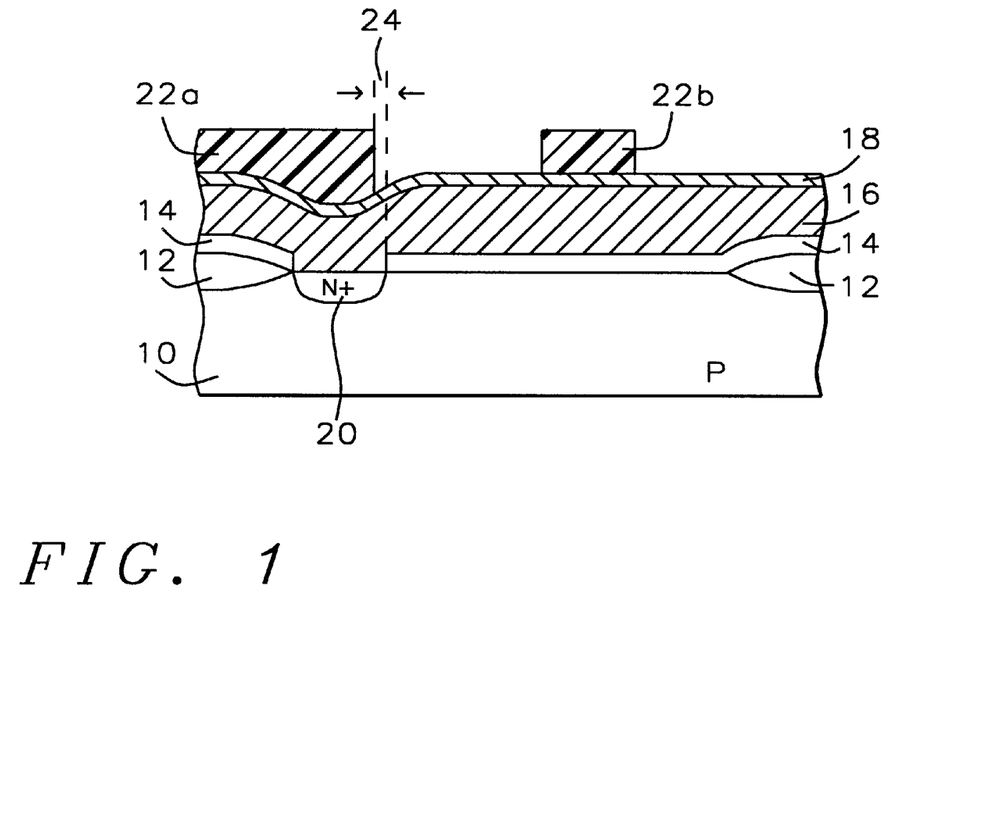
FIG. 1 shows a cross section view of a part of an integrated circuit wafer having a buried contact formed therein.
Figure 2:
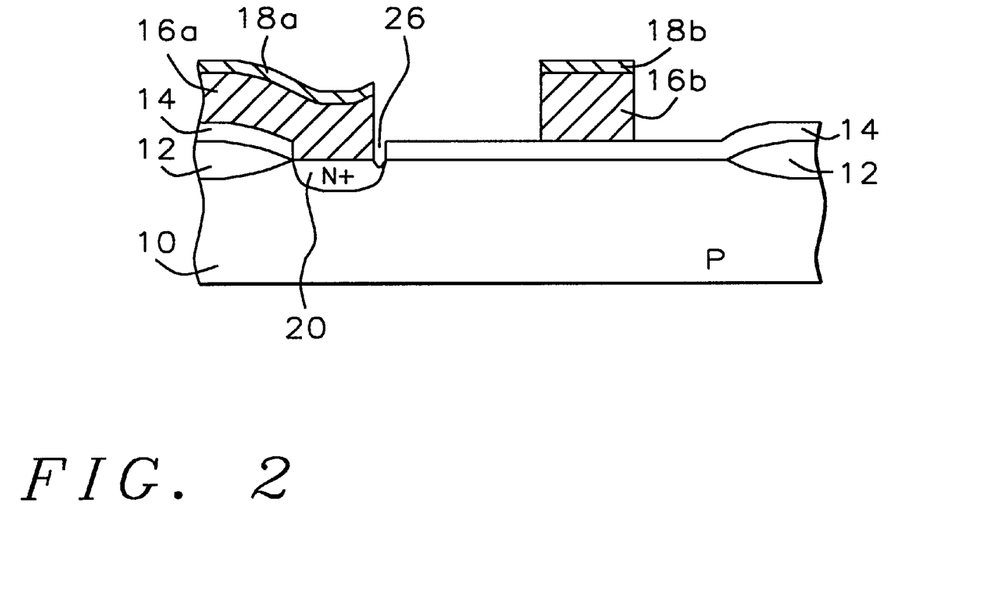
FIG. 2 shows a cross section view of the integrated circuit wafer after the buried contact electrode, the gate electrode, and the buried contact trench have been formed.

This formation of buried contact trenches is shown in FIGS. 1 and 2. FIG. 1 shows a cross section view of a portion of an integrated circuit 10 wafer showing a silicon wafer 10 having field oxide isolation regions 12 and a buried contact 20 formed therein. A layer of gate oxide 14 is formed on the wafer 10. A layer of polysilicon 16 is formed over the layer of gate oxide 14. There is an opening in the layer of gate oxide 14 directly over the buried contact 20 and the buried contact is formed through this opening either by ion implantation before the layer of polysilicon is deposited or by diffusion of impurities from the layer of polysilicon 16 into the wafer 10. A layer of metal silicide 18, such as tungsten silicide, can be formed on the layer of polysilicon 16 to reduce contact resistance. A single thick layer of polysilicon is shown, however a split polysilicon process using two layers of polysilicon can also be used. The layer of metal silicide is optional and may not be used in some circumstances.

A photoresist mask 22a and 22b is then formed on the layer of metal silicide 18 in order to form the buried contact electrode and the gate electrode. As shown in FIG. 2, the metal silicide 18 and polysilicon 16 are then etched to form the buried contact electrode, 16a and 18a, and gate electrode, 16b and 18b, using the gate oxide layer as an etch stop. FIG. 1 shows a misalignment 24 between the part of the photoresist mask 22a used to form the buried contact electrode, 16a and 18a, and the edge of the opening in the layer of gate oxide 14. Due to this misalignment a trench 26, see FIG. 2, is etched in the wafer at the edge of the buried contact 20 because there is no gate oxide present to act as an etch stop.

The trench 26 shown in FIG. 2 adds to the resistance of the buried contact 20 and, if the trench is large enough, can cause circuit malfunction. The greater the misalignment 24 between the photoresist mask 22a and the edge of the opening in the layer of gate oxide 14 the greater will be the size of the trench 26 and the greater will be the resistance increase between the buried contact and the source or drain. It is difficult to determine the amount of the resistance increase before the circuit manufacture is completed which can lead to unnecessary expense in processing wafers which will produce defective chips.

It is a principle objective of this invention to provide a method of using a test site to monitor the degree of misalignment between the photoresist mask and the edge of the opening in the gate oxide layer, the size of the buried contact trench, and the resistance added to the buried contact by the buried contact trench.

It is another principle objective of this invention to provide a test site which can be used to monitor the degree of misalignment between the photoresist mask and the edge of the opening in the gate oxide layer, the size of the buried contact trench, and the resistance added to the buried contact by the buried contact trench.

These objectives are achieved by designating test site regions on the wafer and forming a number of parallel first test electrodes from active regions, which are connected in series, in these test site regions. These test site regions are located in the spaces between the chip regions so that none of the chip regions are used for the test sites. The first test electrodes are formed in active regions, as are the buried contacts. The layers of polysilicon and metal silicide, if metal silicide is used, that are formed over the buried contacts are also formed over the test electrodes. As in the case of the buried contacts, the first test electrodes are formed either by ion implantation before the layer of polysilicon is deposited or by diffusion of impurities from the layer of polysilicon into the wafer. A layer of gate oxide is deposited over the first test electrodes at the same time the gate oxide is deposited on the rest of the wafer. Test openings over the first test electrodes are then etched in the gate oxide layer at the same time the buried contact openings are etched in the gate oxide layer over the buried contact region. The test openings have the same size and shape as the buried contact openings. After the polysilicon and metal silicide, if used, are deposited a photoresist mask is formed to etch the buried contact electrodes, the gate electrodes, and second test electrodes. The second test electrodes have the same size and shape as the test openings and are intended to be located directly above the test openings.

Any misalignment in the photoresist mask will cause trenches to be formed in the buried contacts and in the first test electrodes. These trenches in the first test electrodes will increase the resistance of the first test electrodes. Measuring the amount of resistance increase of the first test electrodes will provide a measure of the amount of misalignment of the photoresist mask. The first test electrodes are located between edges of adjacent active circuit regions and can be parallel to these edges, perpendicular to these edges, or at a 45° degree angle to these edges.

DESCRIPTION OF THE PREFERRED EMBODIMENTS

Refer now to FIGS. 1–10 for a description of the test site and method of this invention for monitoring the formation of trenches in buried contacts. FIG. 1 shows a cross section view of a portion of a silicon integrated circuit 10 wafer having field oxide isolation regions 12 and a buried contact 20 formed therein. A layer of gate oxide 14 is formed on the wafer 10 and a layer of polysilicon 16 is formed over the layer of gate oxide 14. There is an opening in the layer of gate oxide 14 directly over the buried contact 20 and the buried contact 20 is formed through this opening either by ion implantation before the layer of polysilicon is deposited or by diffusion of impurities from the layer of polysilicon 16 into the wafer 10. The drawings show a P type silicon wafer and an N+ buried contact as would be used for an N channel metal oxide semiconductor field effect transistor, NMOS FET. Those skilled in the art will readily recognize that the method and test site of this invention will work equally well for a P channel metal oxide semiconductor field effect transistor, PMOS FET, or a complimentary metal oxide field effect transistor, CMOS FET.

FIGS. 1 and 2 and show a single thick layer of polysilicon 16 and a layer of metal silicide, such as tungsten silicide, on the layer of polysilicon. Those skilled in the art will readily recognize that the method and test site of this invention will work equally well for a split polysilicon process using two layers of polysilicon and for a process which does not use metal silicide. As shown in FIG. 1, a photoresist mask 22a and 22b is then formed on the layer of metal silicide 18, or polysilicon 16 if metal silicide is not used, in order to form the buried contact electrode and the gate electrode. As shown in FIG. 2, the metal silicide 18 and polysilicon 16 are then etched to form the buried contact electrode, 16a and 18a, and gate electrode, 16b and 18b, using dry anisotropic etching and the gate oxide layer as an etch stop. The photoresist mask is then stripped. FIG. 1 shows a misalignment 24 between the part of the photoresist mask 22a used to form the buried contact electrode, 16a and 18a, and the edge of the opening of the opening in the layer of gate oxide 14. Due to this misalignment a buried contact trench 26, see FIG. 2, is etched in the wafer at the edge of the buried contact 20 because there is no gate oxide present to act as an etch stop.

Figure 3:
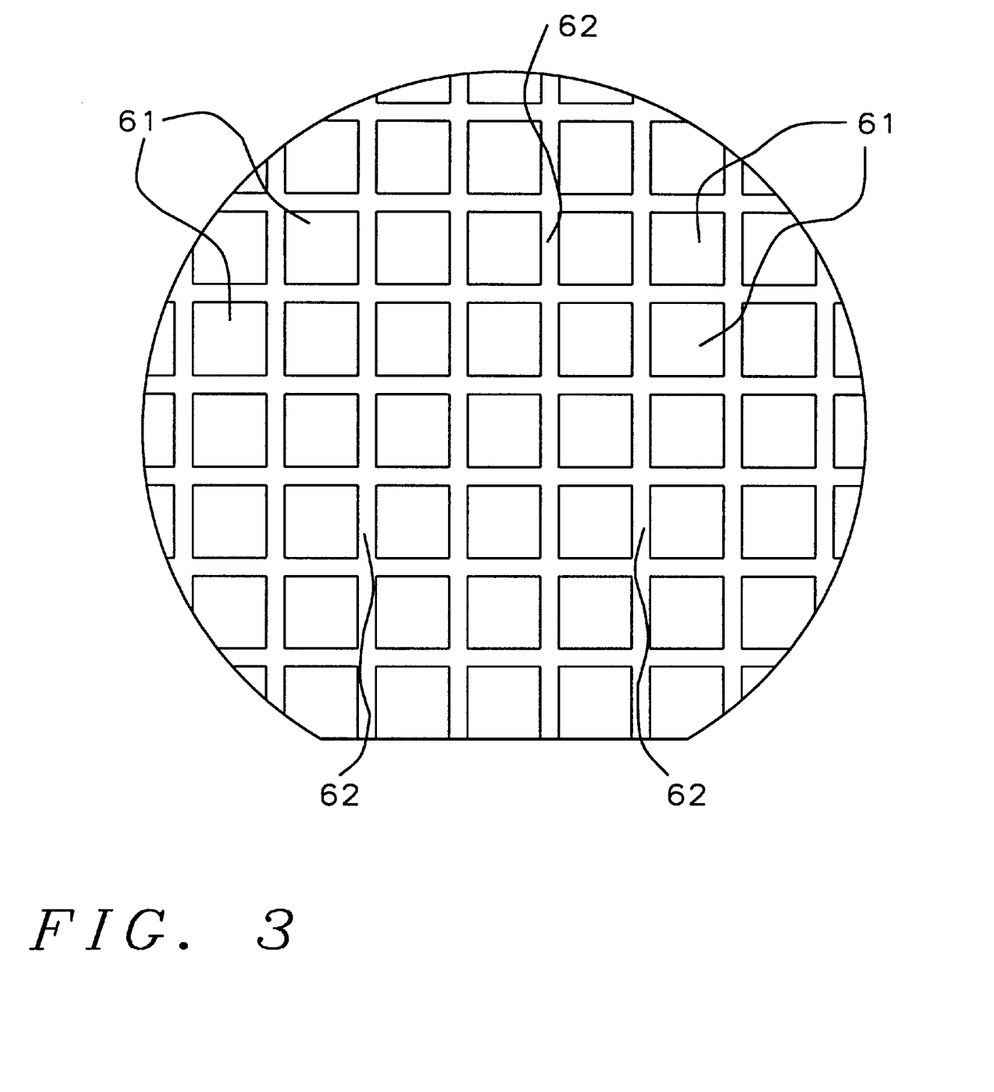
FIG. 3 shows a top view of an integrated circuit wafer showing test site regions and active regions.

FIG. 3 shows a top view of a silicon integrated circuit wafer showing a number of chips 61. The spaces 62 between the chips are used as test site regions. Test sites, which will monitor the extent of buried contact trench formation, will be formed in the test site regions 62 and will be processed simultaneously with the remainder of the wafer.

Refer now to FIGS. 1 and 2, which show part of the chip regions of the wafer, and FIGS. 4–7, which show a part of the test site region of the wafer, for a description of the method of forming test sites which monitor the extent of buried contact trenches. As shown in FIGS. 4–7, a number of first test electrodes are formed in the test site regions using field isolation 12 to separate active regions of the test site region into the first test electrodes 21. A layer of gate oxide 14 is formed on the wafer covering the chip regions of the wafer and the first test electrodes 21. Contact holes are then formed in the layer of gate oxide 14 at the location of the buried contacts in the chip regions of the wafer and a number of test holes are formed in the layer of gate oxide 14 directly over the first test electrodes 21. The contact holes and the test holes have the same size and shape and are squares having sides with a length of between about 0.4 and 1.0 micrometers.

Figure 7:
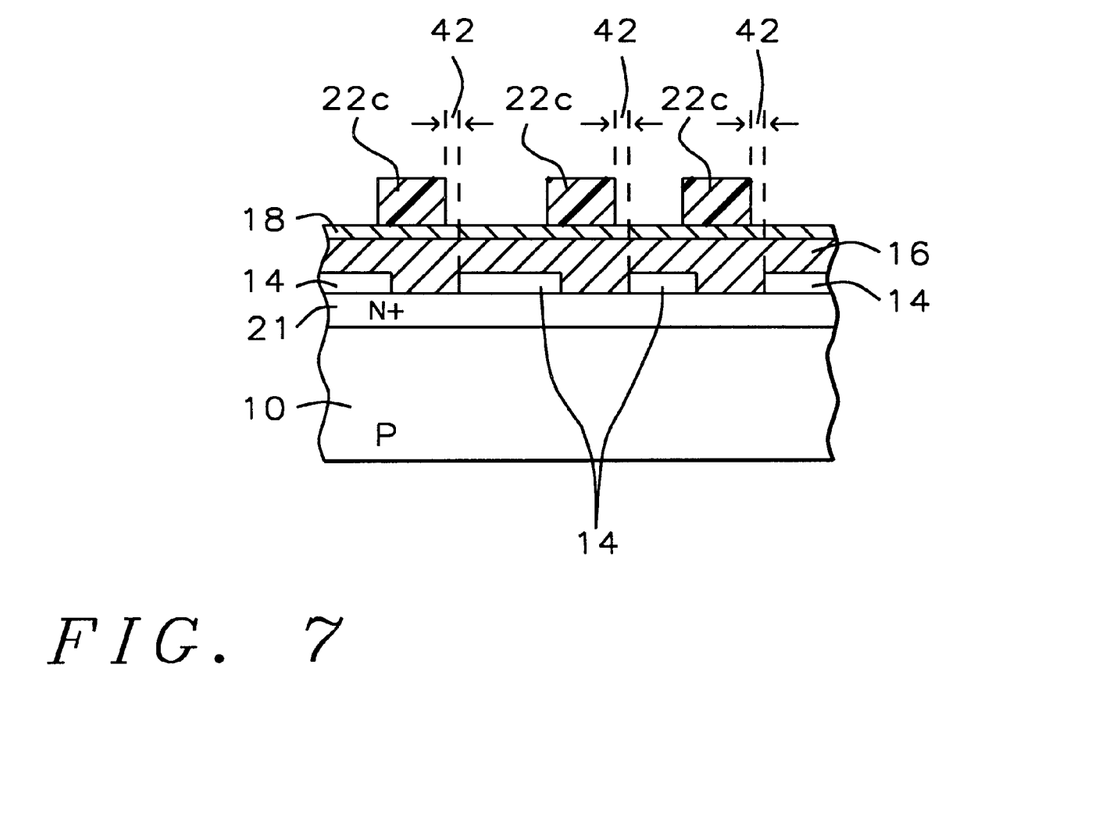
FIG. 7 shows a cross section view of the part of a test site region of FIG. 5 after the photoresist mask used to form the second test electrodes has been formed but before the second test electrodes have been formed.

As shown in FIGS. 1 and 7, a layer of polysilicon 16 and a layer of metal silicide 18 are formed on the wafer. As previously indicated, this example describes a single layer of polysilicon and the use of a metal silicide layer to reduce contact resistance. A split polysilicon process using two layers of polysilicon could also be used. As shown in FIG. 1, a buried contact 20 is formed in the chip regions of the wafer through the contact hole in the gate oxide 14 either by ion implantation before the layer of polysilicon is deposited or by diffusion of impurities from the layer of polysilicon 16 into the wafer 10.

As shown in FIGS. 1 and 7, a photoresist mask 22a and 22b is then formed on the layer of metal silicide 18 in the active region of the wafer in order to form the buried contact electrode and the gate electrode. A photoresist mask 22c, formed from the same layer of photoresist, is formed on the layer of metal silicide 18 in the test site region of the wafer in order to form a second test electrode. As shown in FIGS. 2, 4–6, the metal silicide 18 and polysilicon 16 are then etched to form the buried contact electrode, 16a and 18a in FIG. 2; the gate electrode, 16b and 18b in FIG. 2; and the second test electrode, 16c and 18c in FIGS. 4–6; using dry anisotropic etching and the gate oxide layer as an etch stop. The photoresist mask is then stripped.

Figure 4:
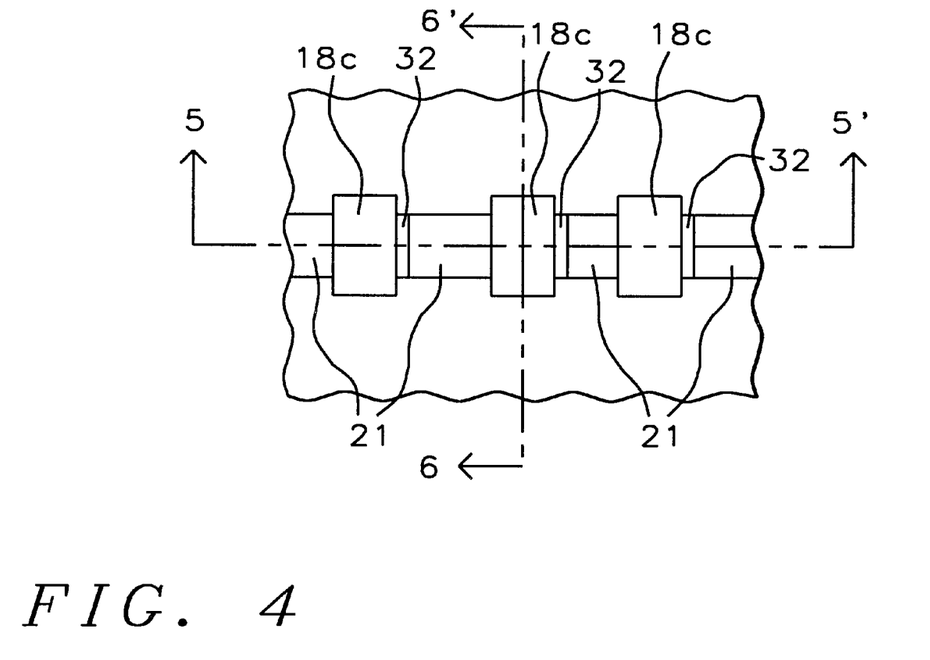
FIG. 4 shows a top view of a part of a test site region showing a part of a first test electrode, three second test electrodes, and three trenches.
Figure 5:
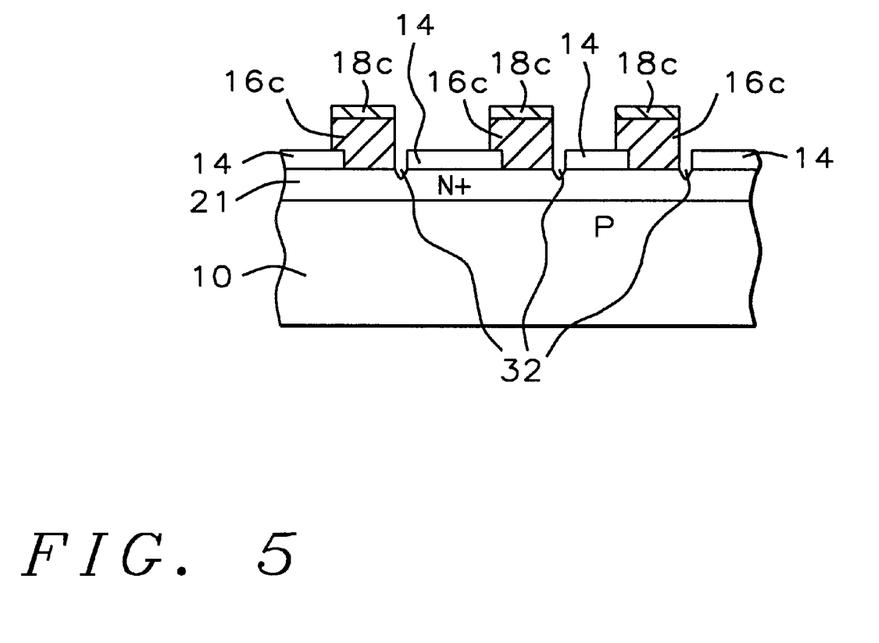
FIG. 5 shows a cross section view of the part of a test site region of FIG. 4 taken along line 5–5' of FIG. 4.
Figure 6:
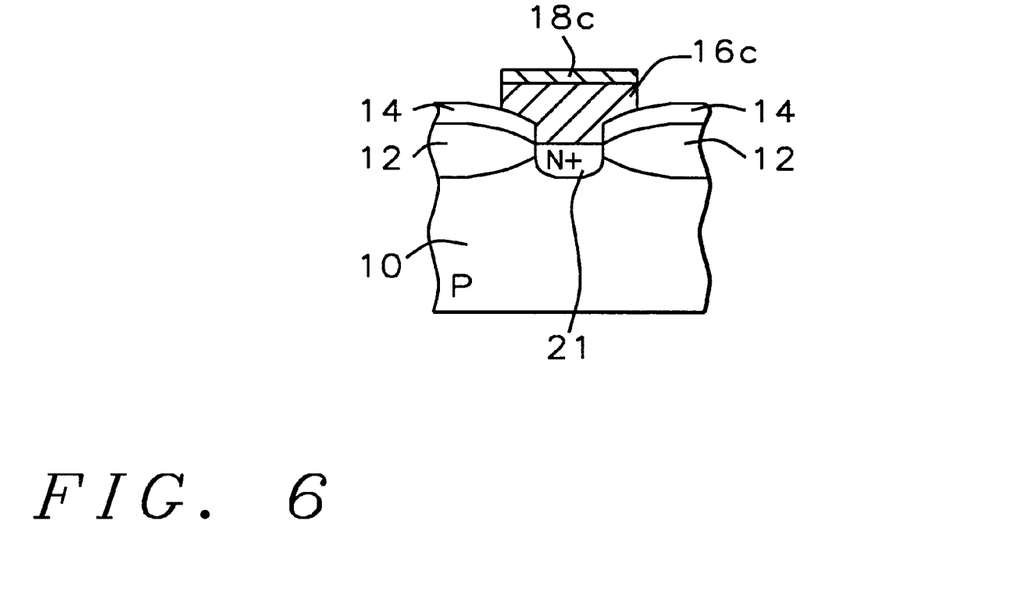
FIG. 6 shows a cross section view of the part of a test site region of FIG. 4 taken along line 6–6' of FIG. 4.

FIG. 1 shows a misalignment 24 between the part of the photoresist mask 22a used to form the buried contact electrode, 16a and 18a, and the edge of the opening in the layer of gate oxide 14 in the active region of the wafer. FIG. 7 shows a misalignment 42 between the part of the photoresist mask 22c used to form the second test electrode, 16c and 18c, and the edge of the opening in the layer of gate oxide 14 in the test site region of the wafer. Due to this misalignment a buried contact trench 26, see FIG. 2, is etched in the wafer at the edge of the buried contact 20 in the chip regions of the wafer and a trench 32, see FIGS. 4–6, is etched in the first test electrode 21 in the test site region of the wafer because there is no gate oxide present to act as an etch stop. Since first test electrode 21 and the buried contact 20 are both highly doped silicon having the same etching properties, the contact hole in the layer of gate oxide and the test hole in the layer of gate oxide have the same size and shape, and any mask misalignment in the active region of the wafer will be repeated in the test site region of the wafer the buried contact trench 26, see FIG. 2, and the trench 32 in the first test electrode 21, see FIGS. 4–6, will be the same.

FIG. 4 shows a top view of a part of a test site region showing the first test electrode 21, three second test electrodes 18c, and three trenches 32 formed in the first test electrode 21. FIG. 5 shows a cross section view of the part of the test site region shown in FIG. 4 taken along line 5–5' of FIG. 4. FIG. 5 shows the trench 32, the polysilicon 16c and metal silicide 18c second test electrode, and the first test electrode 21. FIG. 6 shows a cross section view of the part of the test site region shown in FIG. 4 taken along line 6–6' of FIG. 4. FIG. 6 shows the trench 32, the polysilicon 16c and metal silicide 18c second test electrode, the first test electrode 21, and field oxide regions 12 isolating the first test electrode 21. FIG. 7 shows a cross section view of the part of the test site region shown in FIG. 5 before the second test electrode has been formed showing the layer of polysilicon 16 and metal silicide 18.

Since the buried contact trench and the trench in the first test electrode are the same, monitoring the resistance change of the series string of first test electrodes provides a monitor of the extent of the buried contact trenches.

Figure 8:
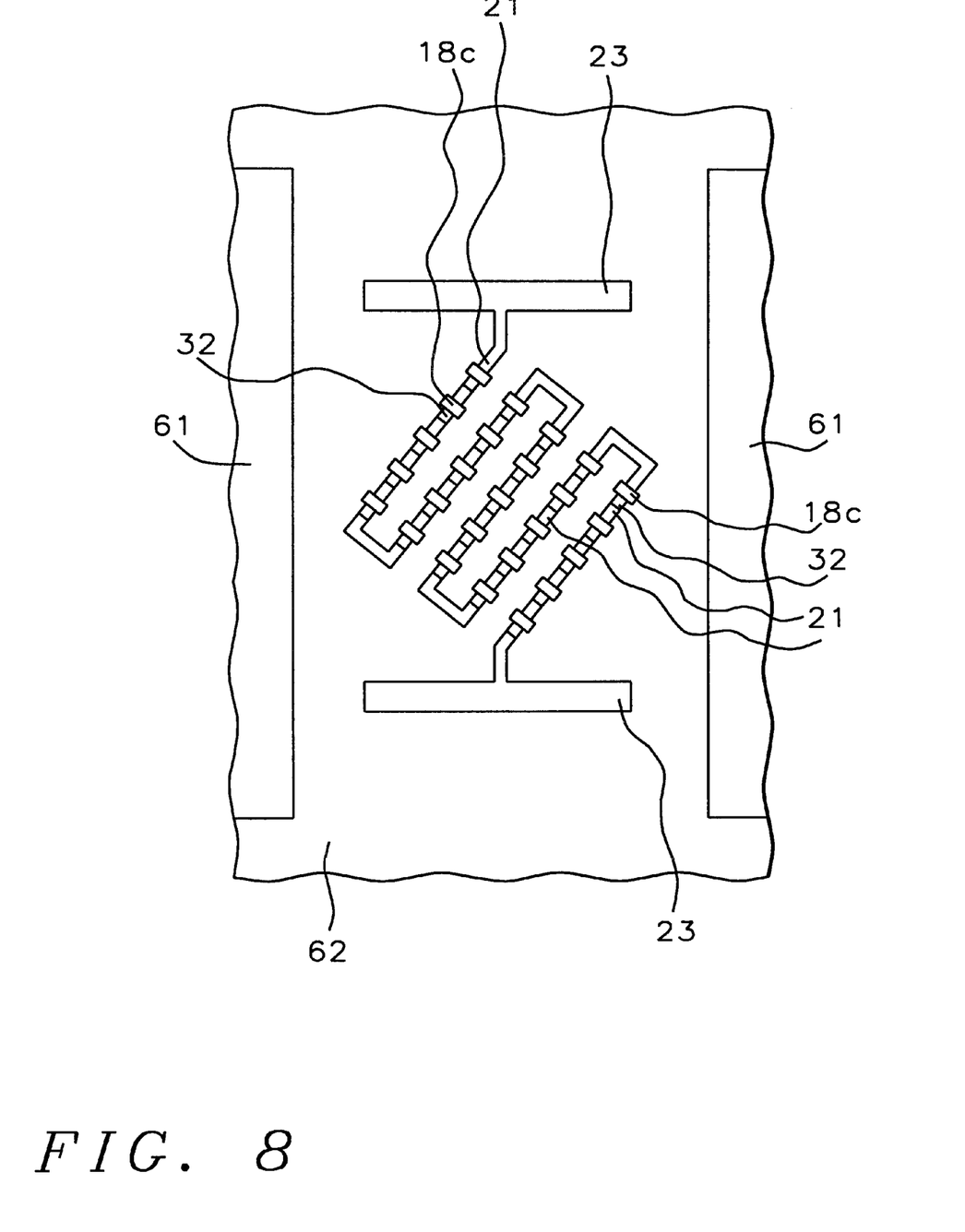
FIG. 8 shows a top view of parallel first test electrodes located at a 45° angle to the edges of the adjacent chip regions of the wafer.
Figure 9:
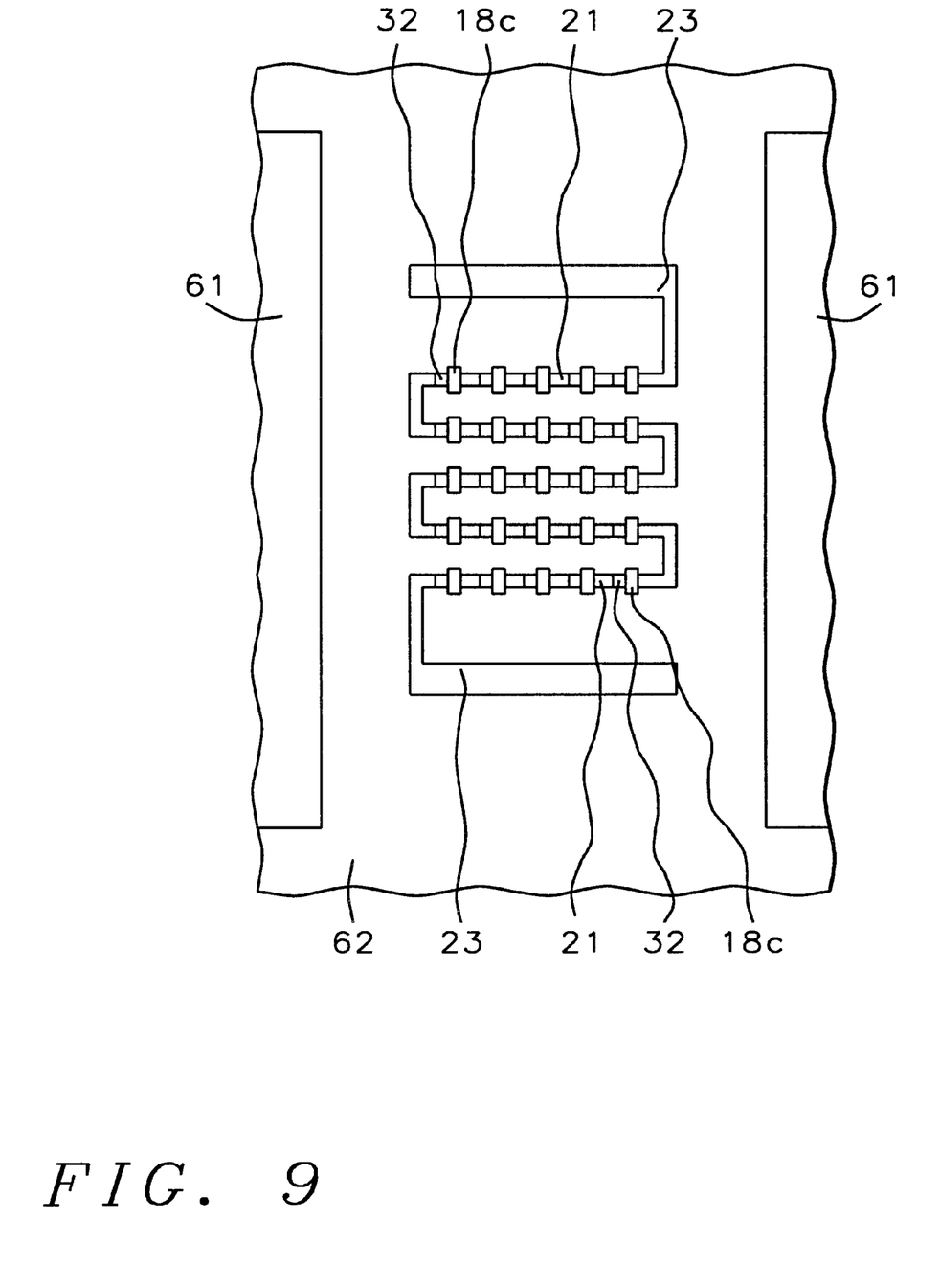
FIG. 9 shows a top view of parallel first test electrodes located perpendicular to the edges of the adjacent chip regions of the wafer.
Figure 10:
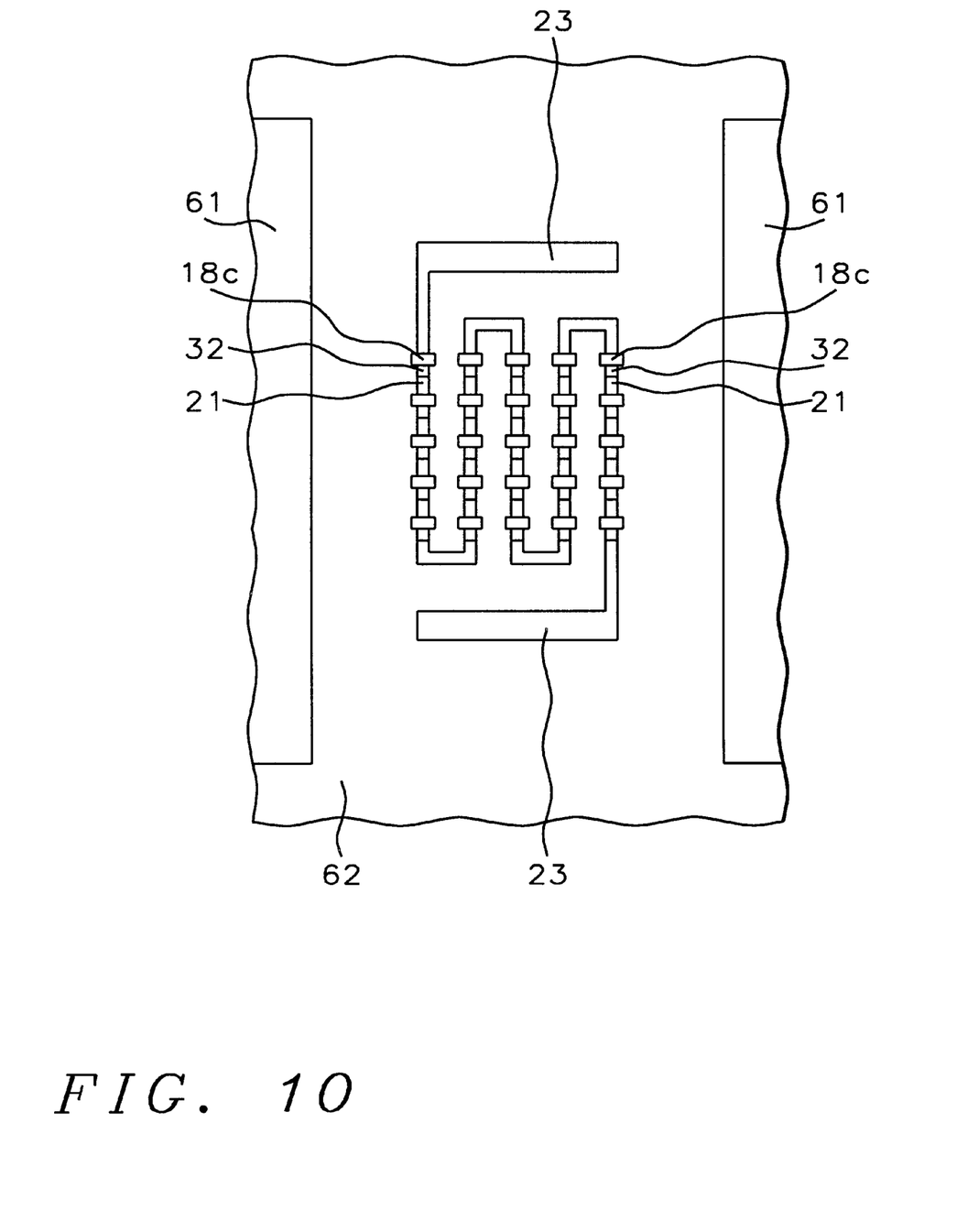
FIG. 10 shows a top view of parallel first test electrodes located parallel to the edges of the adjacent chip regions of the wafer.

FIGS. 8–10 show top views of three test sites showing their orientation with respect to the chip regions 61 of the wafer. Each of the test sites 62 have a number of parallel first test electrodes 21, in this example five, connected in series. Each of the parallel test electrodes 21 have a number of second test electrodes 18c, in this example five. There is a trench 32 at each of the second test electrodes. The first test electrodes 21 are connected in series to a test pad electrode 23 at each end of the series string of first test electrodes. The resistance of the series string of first test electrodes is an indicator of the amount of resistance introduced by the trench 32 at each of the second test electrodes 18c. Thus the resistance of the series string of first test electrodes is an indicator of the size of the trenches at the buried contacts at the chip regions of the wafer.

The size of the buried contact trenches are the result of mask mis-alignment and will be affected by the orientation of the buried contact on the wafer. The test sites are arranged to measure the trench size in all directions on the wafer. FIG. 8 shows the first test electrodes 21 located at a 45° angle with respect to the edges of the adjacent chip regions 61. FIG. 9 shows the first test electrodes 21 perpendicular to the edges of the adjacent chip regions 61. FIG. 10 shows the first test electrodes 21 parallel to the edges of the adjacent chip regions 61. By using all three of these orientations on the wafer the effect of buried contact trenches in all orientations can be measured.

While the invention has been particularly shown and described with reference to the preferred embodiments thereof, it will be understood by those skilled in the art that various changes in form and details may be made without departing from the spirit and scope of the invention.

What is claimed is:

1. A method of monitoring buried contact trench formation, comprising:

providing a silicon integrated circuit wafer having chip regions with edges, test site regions, and a plurality of buried contact regions formed of active regions in said chip regions of said wafer;

forming a first number of parallel first test electrodes on said integrated circuit wafer in each of said test site regions, wherein said parallel first test electrodes are formed by field isolation of active regions in said test site regions and are connected in series;

forming a layer of gate oxide on said integrated circuit wafer, wherein said layer of gate oxide covers said chip regions and said test site regions;

forming contact holes in said layer of gate oxide directly over each of said buried contact regions;

forming a second number of test holes in said layer of gate oxide directly over each of said first test electrodes, wherein said test holes have the same size and shape as said contact holes and are formed at the same time said contact holes are formed;

forming buried contacts through said contact holes in said buried contact regions;

forming a layer of first conductor material on said layer of gate oxide after etching said contact holes and said test holes in said layer of gate oxide;

forming a photoresist mask on said layer of first conductor material;

forming contact electrodes and gate electrodes in said layer of first conductor material using said photoresist mask, dry anisotropic etching of said conductor material, and said layer of gate oxide as an etch stop wherein any misalignment between said contact holes in said gate oxide and said photoresist mask will cause the formation of buried contact trenches in said buried contact regions;

forming second test electrodes in said layer of first conductor material using said photoresist mask, dry anisotropic etching of said conductor material, and said layer of gate oxide as an etch stop wherein said second test electrodes are directly over said test holes in said layer of gate oxide and any misalignment between said test holes in said gate oxide and said photoresist mask will cause the formation of trenches in said first test electrodes; and measuring the resistance of said first test electrodes connected in series, thereby measuring the extent of said trenches in said first test electrodes and therefor also measuring the extent of said buried contact trenches.

2. The method of claim 1 wherein said parallel first test electrodes are parallel to said edges of adjacent said chip regions.

3. The method of claim 1 wherein said parallel first test electrodes are perpendicular to said edges of adjacent said chip regions.

4. The method of claim 1 wherein said parallel first test electrodes are at a 45° angle to said edges of adjacent said chip regions.

5. The method of claim 1 wherein some of said parallel first test electrodes are parallel to said edges of adjacent said chip regions, some of said parallel first test electrodes are perpendicular to said edges of adjacent said chip regions, and some of said first test electrodes are at a 45° angle to said edges of adjacent said chip regions.

6. The method of claim 1 wherein said contact holes and said test holes are squares having sides with a length of between about 0.4 and 1.0 micrometers.

7. The method of claim 1 wherein said layer of first conductor material comprises a layer of polysilicon and a layer of metal silicide.

8. The method of claim 1 wherein said layer of first conductor material comprises a layer of first polysilicon, a layer of second polysilicon, and a layer of metal silicide.

9. The method of claim 1 wherein said first number is greater than or equal to one and said second number is greater than or equal to one.

10. The method of claim 1 wherein said test site regions are located in the spaces between adjacent said chip regions.

11. A test site for monitoring buried contact trench formation, comprising:

a silicon integrated circuit wafer having chip regions with edges and test site regions, wherein a plurality of buried contacts are formed from active regions in said chip regions of said wafer;

a first number of parallel first test electrodes formed on said integrated circuit wafer in each of said test site regions, wherein said parallel first test electrodes are formed by field isolation of active regions in said test site regions and are connected in series;

a layer of gate oxide formed on said integrated circuit wafer wherein said layer of gate oxide covers said chip regions and said test site regions;

contact holes formed in said layer of gate oxide directly over each of said buried contacts and a second number of test holes formed in said layer of gate oxide directly over each of said first test electrodes, wherein said test holes in said layer of gate oxide have the same size and shape as said contact holes in said layer of gate oxide;

a layer of first conductor material formed on said layer of gate oxide after forming said contact holes and said test holes in said layer of gate oxide;

contact electrodes having edges, gate electrodes, and second test electrodes having edges formed in said layer of first conductor material, wherein said second test electrodes are directly over said test holes in said layer of gate oxide;

buried contact trenches formed in said buried contacts at said edges of said contact electrodes in said chip regions of said wafer; and trenches formed in said first test electrodes at said edges of said second test electrodes.

12. The test site of claim 11 wherein said parallel first test electrodes are parallel to said edges of adjacent said chip regions.

13. The test site of claim 11 wherein said parallel first test electrodes are perpendicular to said edges of adjacent said chip regions.

14. The test site of claim 11 wherein said parallel first test electrodes are at a 45° angle to said edges of adjacent said chip regions.

15. The test site of claim 11 wherein said contact holes and said test holes are squares having sides with a length of between about 0.4 and 1.0 micrometers.

16. The test site of claim 11 wherein said layer of first conductor material comprises a layer of polysilicon and a layer of metal silicide.

17. The test site of claim 11 wherein said layer of first conductor material comprises a layer of first polysilicon, a layer of second polysilicon, and a layer of metal silicide.

18. The test site of claim 11 wherein said first number is greater than or equal to one and said second number is greater than or equal to one.

19. The test site of claim 11 wherein said test site regions are located in the spaces between adjacent said chip regions.

* * * * *